United States Patent [19]

Harzer

[11] 4,287,469

[45] Sep. 1, 1981

[54] PROCESS AND CIRCUIT ARRANGEMENT FOR THE MEASURING OF COEFFICIENTS OF MESSAGE-TRANSMISSION EQUIPMENT

[75] Inventor: Peter Harzer, Eningen u. A., Fed. Rep. of Germany

[73] Assignee: Wandel & Goltermann, Eningen u. A., Fed. Rep. of Germany

[21] Appl. No.: 47,927

[22] Filed: Jun. 12, 1979

[30] Foreign Application Priority Data

Jun. 22, 1978 [DE] Fed. Rep. of Germany ....... 2827422

[51] Int. Cl.$^3$ ............................................. G01R 27/26
[52] U.S. Cl. ................................................. 324/57 R
[58] Field of Search ................. 324/57 R, 57 N, 57 Q

[56] References Cited

PUBLICATIONS

French, R. C.; "Transfer Function . . . "; Part I; Electronic Engineering; Aug. 1966; pp. 516–519.
French, R. C.; "Transfer Function . . . "; Part II; Electronic Engineering; Sep. 1966; pp. 588–592.

*Primary Examiner*—Ernest F. Karlsen

*Attorney, Agent, or Firm*—Karl F. Ross

[57] ABSTRACT

A test object, such as a communication path used for data transmission, is examined by applying to its input a measuring signal M consisting of several simultaneously or sequentially generated test frequencies which may be harmonically interrelated, extracting from the output of the test object a distorted version E of the measuring signal, locally generating a compensation signal K with frequency components matching respective test frequencies, and subtracting the two signals E and K from each other to obtain a residual signal $R=E-K$. The compensation signal K is produced by one or more local oscillators and as many frequency converters under the control of regenerating circuitry which locks each of its components in phase and amplitude to the corresponding test frequency. Regeneration takes place in a different frequency range to which the residual signal R is transposed and from which the compensation signal K is retransposed with the aid of a locally generated carrier. Various transmission coefficients can be derived from the three signals R, E, K as well as from control voltages produced in the regenerating circuitry for the amplitude lock.

28 Claims, 7 Drawing Figures

PROCESS AND CIRCUIT ARRANGEMENT FOR THE MEASURING OF COEFFICIENTS OF MESSAGE-TRANSMISSION EQUIPMENT

FIELD OF THE INVENTION

My present invention relates to a process and a circuit arrangement for measuring a plurality of different coefficients representing various transmission characteristics of a test object, particularly of a data-transmission path, in which a predetermined measuring signal is fed to one input of the test object and in which the coefficients are formed from the incoming signal present at an output of the test object and are indicated, emitted and/or stored, for which purpose a reference signal coherent with the measuring signal and generated on the receiving side may possibly be utilized.

BACKGROUND OF THE INVENTION

For the measurement of transmission characteristics such as basic attenuation, frequency-dependent attenuation, frequency-dependent transit time, frequency offset, noise, phase jitter and discontinuous phase changes, harmonics factor, pulse noise, amplification fluctuations and path interruptions it is known to utilize different measuring devices respectively operating according to different, mostly standardized measuring processes. Depending on the type of coefficient to be measured, an input of the test object may have applied to it no measuring signal at all (e.g. for noise measurement), a measuring signal with a single frequency (e.g. for the measurement of amplitude fluctuations or interruptions), a measuring signal with several predetermined frequencies (e.g. for the measurement of the harmonics factor), or a measuring signal with continually or stepwise changing (wobbling) frequency (e.g. for the measurement of the frequency-dependent transit time or of the frequency-dependent attenuation), the measuring signal being modulated in a specific way in some instances. The respective coefficient is obtained from the incoming signal appearing at the output of the test object, possibly with the assistance of a reference signal generated on the receiving side.

The known measuring processes and the known circuit arrangements for their implementation have a number of disadvantages. Thus, it is necessary to employ different measuring devices for the determination of most coefficients on the basis of the different measuring processes, which is expensive and requires cumbersome handling. Especially in the measurement of transmission paths a changeover from the measurement of one coefficient to the measurement of the next coefficient requires always a talking connection between the operating personnel active at opposite ends of the path, which may lead to misunderstandings and errors.

A further disadvantage of the known processes is the relatively slow formation of the result in the measuring of frequency-dependent coefficients, caused by the waiting periods for the attainment of their steady state by the test object and the measuring device, which prevents or at least impedes an oscilloscopic representation and/or a rapid removal (compensation) of the distortion involved.

Likewise, the known processes enable only partly or not at all the simultaneous measurement and emission of some or all coefficients (e.g. group transit time and noise). Finally it appears desirable to form, besides the separate emission of the individual coefficients, a coefficient ("magnitude of overall distortion") facilitating a global yet rapid and unequivocal evaluation of the test object, such a coefficient being suitable for the convergent adjustment of equalizers or other devices positively affecting the transmission quality.

Processes have already been proposed which attempt to circumvent the aforementioned drawbacks in that the test object is energized by a reproducible pulse-type measuring signal which greatly resembles the signal occurring during actual data transmission and whose shape distortion by the test object is analyzed on the receiving side. In that case, however, it is not possible to emit coefficients such as, for example, group transit time or attenuation, in dependence upon frequency, with the known modes of visualization or oscilloscopic representation of said coefficients, nor is there any assurance of satisfactory performance when the test object generates a frequency offset.

It is furthermore disadvantageous that coefficients independent of the transmitted signal, e.g. noise, can be measured not at all or only with the measuring-signal transmitter cut off, which again constitutes a step backward.

From the magazine "Communication Designer's Digest" of June 1969, pages 51 to 53, it is known, in the use of a spectrum analyzer, to visualize modulated signals with high signal-to-noise or high carrier-to-sideband ratio with the aid of means designed to suppress the carrier present in a signal mixture to be analyzed, for the purpose of avoiding overloading, by subtracting from the signal mixture a noisefree auxiliary voltage of the same amplitude and phase as the carrier.

OBJECTS OF THE INVENTION

An object of my invention is to provide a process and a circuit arrangement for the measurement of a plurality of coefficients representing transmission characteristics of a four-terminal network, especially a data-transmission path, which obviates the drawbacks of the known processes and circuit arrangements and in which for the measuring of all coefficients there is always applied the same measuring signal to the test object on the transmitting side, wherein the coefficient to be measured is decided upon only on the receiving side, with possible measurement of several or all coefficients simultaneously.

Another object of my invention is to provide means in such a system for indicating the frequency dependence of a coefficient, or of several coefficients simultaneously can be represented in a stationary oscillogram, enabling a faster recognition of the effect of steps taken to equalize frequency-dependent coefficients than is possible with visualization in a wobble-type measuring station.

A further object of my invention is to provide means for simultaneously but separately obtaining frequency-dependent coefficients, occurring at different frequencies, from a measuring signal containing a plurality of predetermined frequency components.

Still another object is to provide simplified circuitry enabling simultaneous display of all coefficients by means of a measuring signal consisting of a single sinusoidal signal whose frequency successively assumes different values located on lines of a frequency raster.

A more particular object of my invention is to provide means for suppressing the systematic components of the signal during obtention of the coefficient "phase-distortion modulation" and/or of the coefficient "noise level".

Another more particular object of my invention is to provide means for extracting only the systematic components of the compensation signal during the obtention of the coefficient "harmonics factor".

SUMMARY OF THE INVENTION

According to one aspect of my present invention, a test object is examined by applying to its input a measuring signal including at least one predetermined test frequency, extracting from the output of the test object a distorted version of the measuring signal, generating a compensation signal including one or more local oscillations each corresponding to a respective test frequency, subtracting the compensation signal from the distorted signal to produce a residual signal, locking each local oscillation in phase and amplitude to the corresponding test frequency as passed by the test object, and deriving one or more measuring coefficients from at least one of the aforementioned compensation and residual signals.

The phase and amplitude lock is achieved by varying the corresponding parameters of the local oscillation concerned, with reference to those of the distorted signal, until the respective test frequency substantially disappears in the residual signal. The phase variation, of course, also entails a certain frequency modification which may be used to detect frequency offset as described hereinafter.

Pursuant to another aspect of my invention, the above-outlined measuring process is implemented with the aid of subtracting means having a first input connectable to an output of the test object whose input is connected to a source of measuring signals, frequency-generating means delivering the compensation signal to a second input of the subtracting means to produce the residual signal, regenerating circuitry connected to the subtracting means and to the frequency-generating means for locking the local oscillation in phase and amplitude to the aforementioned test frequency, thereby establishing a feedback loop tending to suppress that test frequency in the residual signal, and evaluation means connected to the feedback loop for ascertaining the transmission characteristics to be measured.

Advantageously, as more fully described hereinafter, the frequency-generating means may comprise a first and a second oscillator connected to respective input circuits of a first frequency converter for producing the local oscillation which matches a test frequency of the measuring signal, a second frequency converter being connected to the first oscillator and to the subtracting means for transposing the residual signal to the frequency range of the second oscillator.

According to a further feature of my invention, the regenerating circuitry comprises an adjustable amplifier in one of the input circuits of the first frequency converter, a first and a second sampling switch connected in parallel to an output of the second frequency converter, a first integrator inserted between the first sampling switch and a frequency-controlling input of one of the two oscillators, a second integrator inserted between the second sampling switch and a gain-control input of the adjustable amplifier, and pulse-generating means driven by the oscillator that works into the adjustable amplifier for closing the first sampling switch during zero crossings of a frequency component traversing that amplifier and for closing the second sampling switch at instances offset by 90° from the zero crossings.

When the measuring signal is to encompass a plurality of test frequencies, as is the case in the specific embodiments described hereinafter, these test frequencies as well as the corresponding local oscillations may be generated either simultaneously or sequentially.

BRIEF DESCRIPTION OF THE DRAWING

The above and other features of my invention will now be described in detail with reference to the accompanying drawing in which.

SPECIFIC DESCRIPTION

Figure 1:
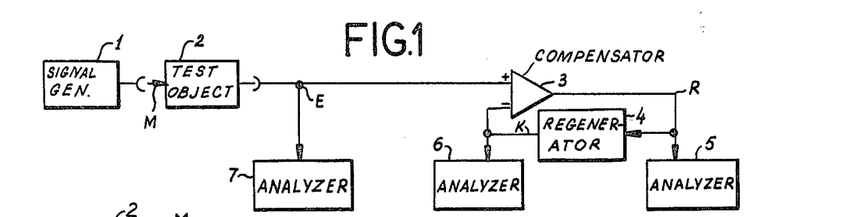
FIG. 1 shows a simplified block diagram of a system embodying my invention.

In the basic arrangement shown in FIG. 1, a measuring-signal generator 1 supplies a measuring signal M to the input of a four-terminal test object 2. The latter can be a message-transmission path, e.g. a data-transmission path or a telephone circuit utilized for data transmission.

In the general case there appears at the output of the test object a reception signal E which contains the measuring signal affected by linear and nonlinear distortions and which may also exhibit a frequency offset and discontinuities as well as spontaneous phase and level deviations (so-called hits).

The distorted incoming signal E arrives at the noninverting input of a compensator 3, i.e. a differential amplifier with an inverting and a noninverting input. Its inverting input is connected to the output of a regenerator 4 which produces a compensation signal K containing only those components of the incoming signal E (with faithful duplication of amplitude and phase) which have a direct counterpart in the measuring signal M. For this purpose the residual signal R appearing at the output of compensator 3 is fed to the regenerator 4. The compensator 3 and the regenerator 4 jointly act as a highly selective "comb-filter switch" in which the components of the incoming signal E having a direct counterpart in the measuring signal appear at the output of the regenerator as the compensation signal K and in which the entire residual signal R = E − K appears at the output of the compensator 3.

From the residual signal R there is obtained in a first functional block 5 a first group of coefficients such as phase-interference modulation, noise level, harmonics factor, amplitude-interference modulation and sum of the broad-band distortions, and from the compensation signal K there is obtained in a second functional block 6 a second group of coefficients such as absolute level, selective (relative) level, frequency offset and possibly frequency-dependent group transit time and/or frequency-dependent phase. In a third functional block 7 it is possible to obtain from the incoming signal E still a third group of further coefficients such as the broad-band level. Blocks 5, 6 and 7 may be termed analyzers.

Figures 2, 3:
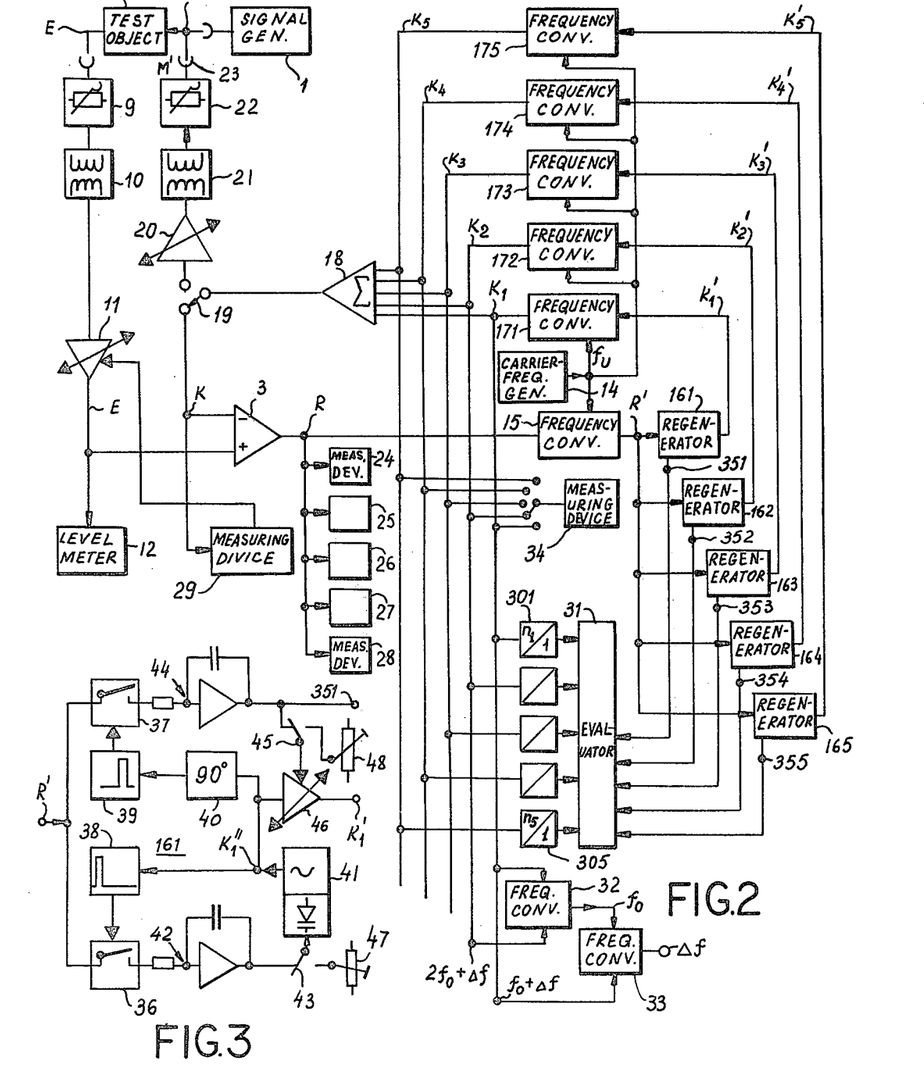
FIG. 2 shows a more detailed block diagram of a first embodiment in which several components of the compensation signal are simultaneously generated in an i-f position and are simultaneously and separately transposed into the original frequency position of the incoming signal in which frequency-dependent coefficients are obtained.
FIG. 3 is a block diagram of one of the functional blocks (e.g. 161) shown in FIG. 2 for the generation of one of the i-f components of the compensation signal.

In the embodiment shown in FIG. 2, a measuring signal M produced by signal generator 1 again lies at the input of test object 2. At the output thereof there appears the signal E, modified according to the properties of the test object 2, which arrives via an attenuator 9 and an isolating transformer 10 at the input of an adjustable amplifier 11. The signal E appearing at the output of the control amplifier 11 arrives on the one hand at a broad-band level meter 12 and on the other hand at the noninverting input of compensator 3 whose second, inverting input receives the compensation signal K. At the output of the compensator 3 there appears the residual signal R which is translated by a frequency converter 15, supplied by a carrier-frequency generator 14 with a carrier frequency $f_u$, into an i-f residual signal R′. Regenerators 161 to 165, which jointly represent component 4 of FIG. 1 and are described in more detail further on with reference to FIG. 3, each generate one of several i-f components $K_1'$ to $K_5'$ which are individually retransposed in respective frequency converters 171 to 175, also energized from the carrier-frequency generator 14, to the original frequency position of the incoming signal E. The sum of the local oscillations $K_1$ to $K_5$ thus generated, formed in an adder 18, yields the compensation signal K which arrives via a switch 19 at the inverting input of compensator 3. Thus, there is provided for each frequency component of the compensation signal, having a direct counterpart in a test frequency of the measuring signal M, a closed amplitude- and phase-control circuit in which the respective component of the compensation signal K appears as a locally generated oscillation. The adder 18, the switch 19, the compensator 3 and the frequency converter 15 are common to all the control circuits whereas each of the control circuits has its own frequency converter 171 to 175 and its own regenerator 161 to 165.

In the other position of switch 19 a signal corresponding to the compensation signal K arrives via an adjustable amplifier 20, an isolating transformer 21 and an attenuator 22 as a measuring signal M′ at an output jack 23 which can be connected to the input of test object 2 in lieu of the measuring-signal generator 1. In this mode of operation of the apparatus as a measuring-signal generator, not illustrated in FIG. 2, the regenerating circuits are supplied with fixed control voltages for amplitude and frequency in a manner further illustrated in FIG. 3.

The residual signal R also arrives at the inputs of measuring devices 24 to 28 for respectively determining the amplitude-interference modulation, the phase-interference modulation, the noise level, the harmonics factor and the sum of the broad-band distortions. (These measuring devices are schematically combined in the analyzer 5 in FIG. 1.)

The entire compensation signal K lies at the input of a measuring device 29 for determining the so-called selective sum level.

The individual components $K_1$ to $K_5$ of the compensation signal K lie at inputs of frequency dividers 301 to 306 whose outputs are connected to an evaluator 31 determining the frequency-dependent group transit time. The evaluator 31 receives simultaneously the level parameters of the control circuits of the regenerators 161 to 165, appearing at terminals 351 to 355, which are proportional to the coefficients "frequency-dependent attenuation" and are integrals of the amplitude samples of the corresponding frequency components of the i-f residual signal R′.

Furthermore, from certain of the components of signal K, there is derived also the frequency offset A. Thus, for example, from two components $f_o + \Delta f$ and $2f_o + \Delta f$ there is first obtained in a frequency converter 32 the frequency $f_o$ and from the latter as well as from the component $f_o + \Delta f$ there is obtained the offset $\Delta f$ in a second frequency converter 33.

Finally, in a measuring device 34 connectable to the several frequency components $K_1$–$K_5$ the amplitude level thereof is selectively determined.

In the regenerator 161 illustrated by way of example in FIG. 3, forming part of the embodiment of FIG. 2, the i-f residual signal R′ arrives at two sampling switches 36, 37 controlled by two pulse shapers 38, 39, pulse shaper 38 being accessed directly whereas pulse shaper 39 is accessed via a 90° phase shifter 40 by a voltage-controlled oscillator 41.

The output voltage of the sampling switch 36—operated without phase shift—arrives at the input of a first integrator 42 whose output is connected in one position of a switch 43 to a frequency-control input of oscillator 41, while the output voltage of the sampling switch 37—operating with a 90° phase shift—arrives at the input of a second integrator 44 whose output voltage arrives, as a quantity proportional to the desired coefficient "frequency-dependent attenuation", via the terminal 351 at the evaluator 31 (FIG. 2) and in a first position of a further switch 45, as a gain-controlling parameter, at a control input of an adjustable amplifier 46 to which the output voltage $K_1''$ of oscillator 41 is applied and whose output voltage represents the i-f component $K_1'$ of the compensation signal which is fed to the associated frequency converter (171 in FIG. 2). In their second positions, not illustrated in FIG. 3, the switches 43 and 45 coupled with each other and with the switch (19 FIG. 2) apply to the frequency-control inputs of oscillator 41 and of adjustable amplifier 46, respectively, fixed biasing voltages settable at potentiometers 47, 48 by which the frequency and the amplitude, respectively, of the corresponding component $K_1$ of the measuring signal M′ deliverable to the output jack (23 in FIG. 2) can be determined.

Figures 4, 5:
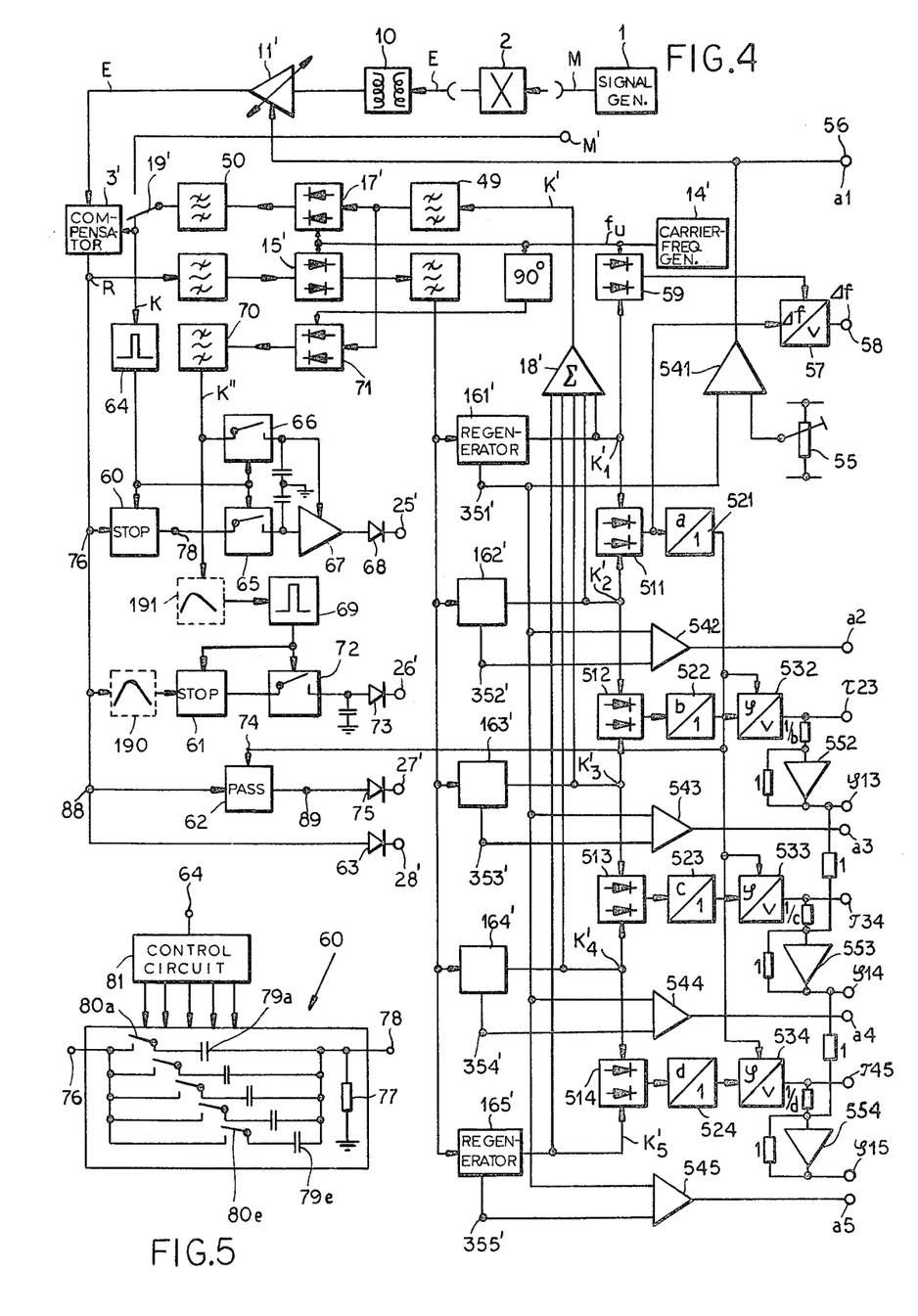
FIG. 4 is a block diagram of a second embodiment in which the frequency-dependent coefficients are obtained in the i-f position.
FIG. 5 is a block diagram of a functional block for suppressing systematic components which is included in the arrangement of FIG. 4.

The embodiment shown in FIG. 4 deviates from that illustrated in FIG. 2 essentially as concerns the generation of the compensation signal K and the obtention of the frequency-dependent coefficients. Functional blocks of FIG. 4 corresponding to those of FIG. 2 are provided with the same reference numerals supplemented by a prime mark.

The adder 18′ combines the i-f components $K_1'$ to $K_5'$, produced in the several regenerators 161′ to 165′, to an i-f compensation signal K′ which is retransposed to the original frequency position with the aid of a single frequency converter 17′ forming a common constituent of all amplitude- and phase-control circuits. Upstream and downstream of frequency converter 17' there is provided a respective band-pass filter 49 for the i-f position and 50 for the original position.

The coefficients "frequency-dependent attenuation" (a2 to a5) are derived from the gain-controlling parameters for the i-f components K1' to K5' appearing at the terminals 351' to 355' of the regenerators 161' to 165' and the coefficients "frequency-dependent phase" ($\phi 13$ to $\phi 15$), "frequency-dependent group transit time" ($\tau 23$, $\tau 34$, $\tau 45$) and "frequency offset" ($\Delta f$) are obtained from the i-f components K1' to K5' of the compensation signal.

For the generation of the coefficients "frequency-dependent group transit time" difference-frequency signals between two neighboring frequency components are formed in a respective frequency converter 511 to 514 and are frequency divided by a divisor a, b, c or d (gap widths) proportional to the respective frequency difference. The phase differences between the other frequency-divided difference-frequency signals and the one emitted by divider 521, serving as a reference oscillation, are ascertained in a respective phase discriminator 532 to 534 and are emitted as "signals" $\tau 23$, $\tau 34$, $\tau 45$.

From the respective coefficients for the "frequency-dependent group transit time" the coefficients "frequency-dependent phase" $\phi 13$, $\phi 14$, $\phi 15$ are formed by multiplication, via weighting amplifiers 552 to 554, with factors proportional to the respective divisors b, c or d of the associated frequency dividers 522 to 524; these amplifiers, having feedback resistors of unity value and input resistors of fractional value, are cascaded via output resistors of unity value for summing over the respective measuring range.

For generation of the coefficients "frequency-dependent attenuation" the differences between the level parameter at terminal 351' of regenerator 161', serving as a reference value, and the level parameters appearing at terminals 352' to 355' of the remaining regenerators 162' to 165' are formed in respective differential amplifiers 542 to 545 and are emitted as signals a2 to a5 also serving to adjust input amplifier 11.

For the generation of a coefficient "absolute level" there is formed in a further differential amplifier 541 the difference between the level parameter at terminal 351' of regenerator 161', serving as a reference value, and a normal voltage tapped off a voltage divider 55 and is emitted at a terminal 56 as a signal a1.

For the generation of the coefficient "frequency offset" there is formed in a differential-frequency/voltage converter 57 a voltage and is emitted at terminal 58 as a signal $\Delta f$ proportional to the difference of two differential frequencies. The first differential frequency, containing the frequency offset $\Delta f$, is generated in a frequency converter 59 to which the frequency fu of carrier generator 14' and the i-f component $K_1'$ of regenerator 161' are delivered. The second differential frequency, devoid of frequency offset $\Delta f$, is generated in the frequency converter 511 to which the two i-f components $K_1'$ and $K_2'$ of regenerators 161' and 162' are supplied. This requires that, as in FIG. 2, the test frequencies corresponding to the retransposed local oscillations $K_1$ and $K_2$ have the harmonically related values $f_o$ and $2f_o$.

From the residual signal R generated by compensator 3' there are obtained the coefficients "phase-interference modulation", "noise level", "harmonics factor" and "quantity of global distortion".

The output of compensator 3' is connected to the inputs of a first stop 60 the and a second stop 61 for suppressing systematic components of the residual signal R, a pass 62 for clearing systematic components of the residual signal R, and an RMS rectifier 63. A pulse shaper 64 having its input connected to the output of compensator 3' carrying the compensation signal K is connected at its output to the control inputs of the first stop 60, of a first sample-and-hold circuit 65 and of a second sample-and-hold circuit 66 whose outputs are connected to storage capacitors. The outut of the first stop 60 is connected to an input of the first sample-and-hold circuit 65 whose output lies at the input of an adjustable amplifier 67 working into to the input of a peak rectifier 68 which carries the voltage proportional to the coefficient "phase-interference modulation" at its output terminal 25'. The control-voltage input of adjustable amplifier 67 is connected to the output of the second sample-and-hold circuit 66 whose inut is connected together with the input of a second pulse shaper 69 via a band-pass filter 70 to the output of a frequency converter 71 which emits a compensation signal K" shifted by 90°.

The output of the second pulse shaper 69 is connected to control inputs of the second stop 61 and of a third sampling switch 72 whose input lies at the output of stop 61. The output of this third sample-and-hold circuit 72, likewise provided with a storage capacitor, is connected to the input of an RMS rectifier 73 whose output terminal 26' carries a voltage proportional to the coefficient "noise level".

The pass 62 is connected by its control input 74 to the output of frequency divider 521 and by its output with the input of an RMS rectifier 75 whose output terminal 27' carries a voltage proportional to the coefficient "harmonics factor".

The output terminal 28' of the RMS rectifier 63 carries a voltage proportional to the coefficient "quantity of global distortion".

For the generation of the coefficient "phase-interference modulation" the systematic components of the residual signal R are suppressed in the stop 60 (also representative of stop 61) more fully described with reference to FIG. 5. The passed nonsystematic components of the residual signal R arrive at the first sample-and-hold circuit 65 which is actuated by the output signals of the pulse shaper 64 emitting its control pulses at the time of the positive zero crossings of the compensation signal K. The output of the sample-and-hold circuit 65 is weighted by means of the adjustable amplifier 67 with a weighting signal obtained in sample-and-hold circuit 66 and is fed to peak rectifier 68 which emits the coefficient "phase-interference modulation" at the terminal 25'. The sample-and-hold circuit 66, which is likewise actuated by the output pulses of the pulse shaper 64, samples the 90°-phase-shifted compensation signal K", which is delivered by the frequency converter 71, and generates the weighting signal for the adjustable amplifier 67.

For the generation of the coefficient "noise level" the systematic components of the residual signal R are suppressed in the second stop 61. The passed nonsystematic components of the residual signal R are delivered to the third sample-and-hold circuit 72 which is actuated by the output pulses of the second pulse shaper 69 emitting them at the time of the positive-going zero crossings of the 90°-phase-shifted compensation signal K". The output signal of the sample-and-hold circuit 72 is fed to an RMS rectifier 73 which emits the coefficient "noise level" at the terminal 26'.

For the generation of the coefficient "harmonics factor" the nonsystematic components of the residual signal R are suppressed in the pass 62 controlled by the reference frequency which is delivered by the divider 521. The passed systematic components are transmitted to the RMS rectifier 75 which emits the coefficient "harmonics factor" at the terminal 27'.

For the generation of the coefficient "quantity of global distortion" the residual signal R is fed to the RMS rectifier 63 which emits this coefficient at the terminal 28'.

In the stop 60 illustrated as an active filter in FIG. 5 there are disposed between an input terminal 76, energized by the residual signal R, and an output terminal 78, which carries only the nonsystematic components of the residual signal and is connected to ground via a resistor 77, a number of parallel longitudinal branches corresponding to the number n (n=5 in FIGS. 4 and 5) of the regenerated compoents $K_1'$ to $K_5'$ of the compensation signal and thus to the maximum number of subcycles occurring in a cycle of the residual signal R, each of these branches consisting of a series combination of a storage capacitor 79a to 79e and a sampling switch 80a to 80e. The sampling switches are briefly operated, cyclically, in the rhythm of the control pulses delivered by the driving pulse shaper 64 (or 69 in the case of stop 61), by a control circuit 81 which comprises a ring counter and control logic. These pulse shapers emit their control pulses in the case of stop 60 for the obtention of the coefficient "phaseinterference modulation" in respective unidirectionally occurring zero crossings of the compensation signal K and in the case of stop 61 for the obtention of the coefficient "noise level" in respective unidirectionally occurring zero crossings of the 90°-phase-shifted signal K". Capacitors 79a–79e only transmit voltage changes occurring between successive closures of switches 80a–80e.

Figure 6:
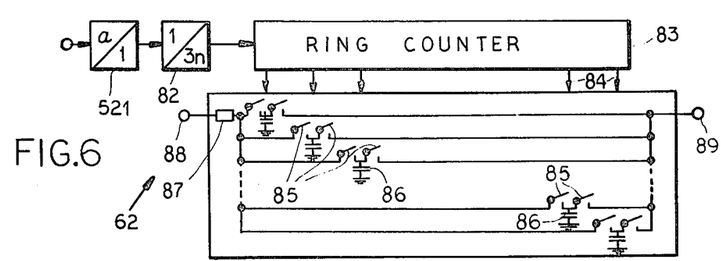
FIG. 6 is a block diagram of a functional block for suppressing nonsystematic components which is included in the arrangement according to FIG. 4.

The pass 62 (FIG. 4) illustrated in FIG. 6 for extraction of the residual signal R and for the suppression of its nonsystematic components is another active filter which utilizes the fact that not only the components of the compensation signal but also their multiples and mixture products lie on equidistant lines of a frequency raster whose separation corresponds to the reference frequency, thus to the lowest frequency of the system. The pass is formed by a sampling filter which with n successive harmonics of the reference frequency has unequivocal pass bands and is provided for this purpose with 3n cyclically operated sampling-switch pairs which are operated via a control-logic network at three times the reference frequency.

For this purpose the reference frequency ($K1' - K2'/a$ (supplied, for example, by the frequency divider 521 in FIG. 4) is multiplied by the factor 3n with the aid of a frequency multiplier 82 and is delivered to a ring counter 83 with 3n stages in which only a single stage is marked at a time and whose parallel outputs contain 3n pulse shapers whose pulse outputs 84 operate a respective one of 3n pairs of longitudinal switches 85 whose junctions are grounded via respective storage capacitors 86. One switch of each pair 85 is connected at its side remote from the junction to one end of a common resistor 87 whose other end lies at the input terminal 88 of the pass. The other switch of each pair 85 is connected at its side remote from the junction to an output terminal 89 of the pass.

With the embodiment, illustrated in FIG. 4, the residual signal R can be psophometrically weighted, prior to the suppression of its systematic components, by the insertion of a psophometric or noise-measuring filter 190, shown dotted in FIG. 4, ahead of the input of the second stop 61. In this case the psophometrically weighted residual signal is sampled at the time of the unidirectionally occurring zero crossings of the 90°-phaseshifted compensation signal K" which is likewise psophometrically weighted, for which purpose a psophometric filter 191 also shown dotted in FIG. 4 is inserted ahead of the second pulse shaper 69.

Figure 7:
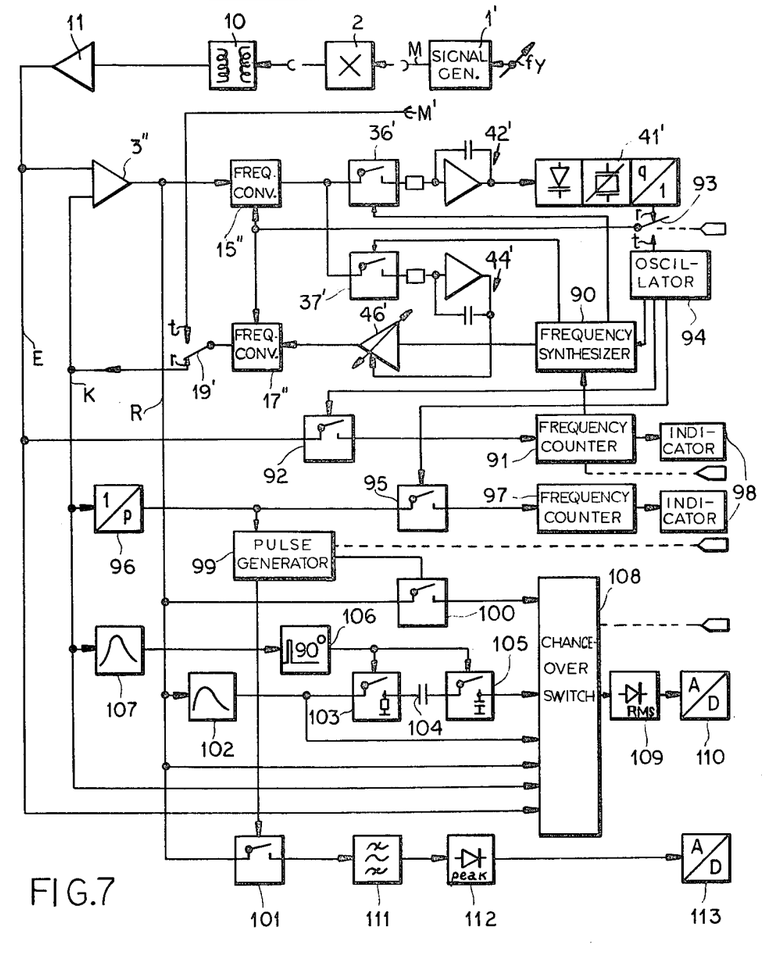
FIG. 7 is a block diagram of a third, calculator-controlled embodiment in which the measuring signal is a series of frequencies.

The embodiment, shown in FIG. 7 differs in several respects from the preceding ones. It utilizes a measuring signal M consisting of a single sinusoidal signal whose frequency fy, emitted by an adjustable signal generator 1; successively assumes—within the frequency band of the test object to be measured—respective ones of a series of predetermined values which substantially correspond to respective multiples of a common fundamental frequency (reference frequency). The signal K for compensating the component of the incoming signal E corresponding to the respective measuring test frequency of measuring signal M is generated in an i-f position by a frequency synthesizer 90 which is coarsely preset to the corresponding incoming frequency component on the i-f side with the aid of a frequency counter 91 measuring the incoming frequency component E in the original spectral position. The adjustment of the device and the evaluation of the measuring results occurs with the aid of a computer not further illustrated.

In this embodiment a first input of a compensator 3", to whch the incoming signal E is applied and whose output is connected to the input of a frequency converter 15", is again energized from amplifier 11 whose output is further connected via a gate circuit 92 to the input of the frequency counter 91. An output of the frequency converter 15" is joined to two sampling switches 36', 37' whose control inputs are connected to two control outputs of the frequency synthesizer 90 which carry voltages relatively phase-shifted by 90°. The output of each sampling circuit 36', 37' lies at the input of a respective integrator 42', 44'. The output of the first integrator 42' is connected to the control input of a voltage-controlled carrier-frequency oscillator 41' and the output of the other integrator 44' is connected to the control input of an adjustable amplifier 46'. Thus, elements 36', 37', 41', 42', 44' and 46' have the same phase-locking and amplitude-locking function functions as their counterparts in the regenerator 161 of FIG. 3. The input of the adjustable amplifier 46' lies at the output of the frequency synthesizer 90 and its output lies at the input of a second frequency converter 17". The output of frequency converter 17" supplying the compensation signal K is connected via a reversing switch 19' in the position "reception" (r) thereof to the second input of compensator 3" and in its position "transmission" (t) to an output terminal for a measuring signal M'. The carrier-frequency inputs of the two frequency converters 15" and 17" jointly lie at a reversing switch 93, coupled with reversing switch 19', which selectively extends them to one of the outputs of the voltage-controlled carrier-frequency oscillator 41' or of a normal-frequency oscillator 94 delivering a (median) standard carrier frequency. Further outputs of the latter are connected to a referencefrequency input of frequency synthesizer 90 and to control inputs of the gate circuit 92 as well as of a second gate circuit 95. Parallel outputs of the frequency coungter 91 lie at frequencypresetting inputs of frequency synthesizer 90.

The compensation signal K, supplied via switch 19' by converter 17", is fed on the one hand to a second input of compensator 3" and on the other hand to the input of a frequency multiplier 96 of step-up ratio p:1 whose output lies at the input of the second gate circuit 95. A frequency counter 97 is connected at its input side to the output of gate circuit 95 and at its output side to the input of an indicating unit 98; another such unit has an input connected to counter 91.

At the output of frequency multiplier 96 there lies further the input of a pulse generator 99 whose outputs are connected to the control inputs of two gate circuits 100 and 101 receiving the residual signal R from compensator 3". The compensator output is further connected to the input of a first psophometric filter 102 whose output lies at the input of a sampling switch 103 having its output connected via an isolating capacitor 104 to the input of a further sampling switch 105. The control inputs of both sampling switches 103 and 105 lie at the output of a pulse shaper 106, supplying pulses shifted by 90°, whose input lies at the output of a further psophometric filter 107 having its input connected to the contact of switch 19' ties to the second input of comparator 13".

At respective inputs of an electronic 6-inputs 1-output changeover switch or multiplexer 108, whose output is connected to the input of an RMS rectifier 109 the output of which lies at the input of an analog/digital converter 110 connected to a digital indicating, evaluating or storage device not further illustrated, there lie for obtention of the coefficient "harmonics factor" the output of sampling switch 100, for obtention of the coefficient "noise level" the output of the sampling switch 105, for obtention of the coefficient "weighted broad-band residual level" the output of psophometric filter 102, for obtention of the coefficient "broad-band residual level" the output of compensator 3", for obtention of the coefficient "selective level" the output of amplifier 11 feeding the first input of compensator 3", and for obtention of the coefficient "broad-band sum level" the contact r of switch 19' connected of the second input of compensator 3".

The sampling switch 101 is connected by its output via a band-pass filter 111 to the input of a peak rectifier 112 whose output lies at the input of a further analog/digital converter 113 emitting the coefficient "phase-interference modulation" to a digital indicating, evaluating or storage device not further illustrated.

I claim:

1. A process for measuring transmission characteristics of a test object, comprising the steps of:
   (a) generating a measuring signal including at least one predetermined test frequency;
   (b) applying said measuring signal to an input of the test object;
   (c) extracting a distorted signal from an output of the test object;
   (d) generating a compensation signal including at least one local oscillation corresponding to said test frequency;
   (e) differentially combining said distorted signal and said compensation signal to produce a residual signal;
   (f) varying the relative phase and amplitude of said local oscillation and said distorted signal until said test frequency substantially disappears in said residual signal; and
   (g) deriving at least one coefficient representative of a transmission characteristic from at least one of said residual and compensation signals.

2. A process as defined in claim 1 wherein the measuring signal is composed of a plurality of test frequencies matched by as many local oscillations in said compensation signal, said local oscillations being generated in separate oscillators that are provided with individual phase-locking and amplitude-locking loops controlled by said residual signal.

3. A process as defined in claim 1 wherein said measuring signal is constituted by a plurality of sequentially generated test frequencies and said local oscillation is successively modified to match said test frequencies.

4. A process as defined in claim 2 wherein two of said test frequencies are harmonically related to each other in a ratio of 1:2 to enable the determination of a frequency offset in step (g).

5. A process as defined in claim 4 wherein said frequency offset is determined in step (g) by forming the difference between two local oscillations phase-locked to said two test frequencies and differentially combining the resulting difference frequency with the lower one of said phase-locked local oscillations.

6. A process as defined in claim 4 wherein said local oscillations are the products of interaction of a fixed carrier frequency with respective output frequencies of said local oscilllators, said residual signal being transposed to the range of said output frequencies by interaction with said carrier frequency, said frequency offset being determined in step (g) by forming the difference between two output frequencies phase-locked to respective constituents of the residual signal corresponding to said two test frequencies, forming the difference between the lower one of said phase-locked output frequencies and said carrier frequency, and subtracting said differences from each other.

7. A process as defined in claim 2, 4 or 6 wherein step (g) includes a comparison between control voltages generated in respective amplitude-locking loops for a determination of relative attenuation.

8. A process as defined in claim 7 wherein the amplitude of said distorted signal is modified in response to differences between one of said control voltages and a fixed reference voltage.

9. A process as defined in claim 6 wherein, with a number of local oscillators greater than two, step (g) includes mixing the output frequency of one local oscillator with that of another local oscillator separated therefrom by a first frequency gap to form a first difference-frequency signal, mixing the output frequency of said other local oscillator with that of a further local oscillator separated therefrom by a second frequency gap to form a second difference-frequency signal and, in the event of different widths of said frequency gaps, reducing said difference-frequency signals by frequency division to a common frequency level prior to translating any phase difference thereof into an output voltage representative of frequency-dependent group transit time.

10. A process as defined in claim 9 wherein step (g) further includes multiplying said output voltage by a factor equal to a division used in said frequency division for obtaining a coefficient representative of frequency-dependent phase.

11. A process as defined in claim 1 wherein, with a plurality of higher test frequencies harmonically related to the lowest test frequency, step (g) includes suppressing systematic components of said residual signal, sampling the remaining nonsystematic components of the residual signal during zero crossings of said compensation signal, integrating the signal samples thus obtained, and weighting the integrated signal samples with the integrated samples of said compensation signal obtained at instants offset by 90° from the zero crossings thereof to produce a coefficient representative of phase-interference modulation.

12. A process as defined in claim 1 wherein, with a plurality of higher test frequencies harmonically related to the lowest test frequency, step (g) includes suppressing systematic components of said residual signal, sampling the remaining nonsystematic components of the residual signal during zero crossings of said compensation signal phase-shifted by 90°, and integrating the resulting signal samples to produce a coefficient representative of noise level.

13. A process as defined in claim 12 wherein said residual signal is psophometrically weighted prior to the suppression of said systematic components thereof, the compensation signal phase-shifted by 90° being subjected to psophometric weighting prior to determination of the zero crossings thereof.

14. A process as defined in claim 11, 12 or 13 wherein the suppression of said systematic components comprises cyclically sampling said residual signal in the rhythm of the zero crossings of said compensation signal, at staggered instants during each cycle thereof, and registering voltage changes occurring between samplings in successive cycles.

15. A process as defined in claim 11, 12 or 13 wherein step (g) further includes periodically sampling said residual signal a number of times equal to a multiple of the number of test frequencies during each cycle of a subharmonic of the lowest test frequency, storing the samples so obtained, combining the stored samples into a composite signal, and taking the RMS value of said composite signal as a coefficient representative of harmonics factor.

16. A process as defined in claim 2, 4 or 6 wherein step (g) includes taking the RMS value of said residual signal as a coefficient representative of overall distortion.

17. A circuit arrangement for measuring transmission characteristics of a test object, comprising:
a source of measuring signals including at least one predetermined test frequency to be fed to an input of the test object;
frequency-generating means operable to produce a compensation signal including at least one local oscillation corresponding to said test frequency;
subtracting means with a first input connectable to an output of the test object and with a second input connected to receive said compensation signal from said frequency-generating means for differentially combining same with a distorted measuring signal issuing from said test object, thereby giving rise to a residual signal;
regenerating circuitry connected to said subtracting means and to said frequency-generating means for locking said local oscillation in phase and amplitude to said test frequency as passed by the test object, thereby establishing a feedback loop tending to suppress said test frequency in said residual signal; and
evaluation means connected to said feedback loop for ascertaining the transmission characteristics to be measured.

18. A circuit arrangement as defined in claim 17 wherein said frequency-generating means comprises a first and a second oscillator, first frequency-conversion means with input circuits respectively connected to said oscillators for producing said local oscillation, and second frequency-conversion means connected to said first oscillator and to said subtracting means for transposing said residual signal to the frequency range of said second oscillator.

19. A circuit arrangement as defined in claim 18 wherein said regenerating circuitry comprises an adjustable amplifier in one of said input circuits, a first and a second sampling switch connected in parallel to an output of said second frequency coversion means, first integrating means inserted between said first sampling switch and a frequency-controlling input of one of said oscillators, second integrating means inserted between said second sampling switch and a gain-control input of said adjustable amplifier, and pulse-generating means driven by the oscillator connected to said one of said input circuits for closing said first sampling switch during zero crossings of a frequency component traversing said adjustable amplifier and for closing said second sampling switch at instants offset by 90° from said zero crossings.

20. A circuit arrangement as defined in claim 19 wherein said one of said oscillators is said first oscillator, said one of said input circuits being connected to said second oscillator and including frequency-changing means in cascade with said adjustable amplifier for sequentially producing a plurality of local oscillations corresponding to as many test frequencies sequentially applicable to the test object, said pulse-generating means comprising respective outputs of said frequency-changing means.

21. A circuit arrangement as defined in claim 20 wherein said frequency-changing means comprises a frequency synthesizer controlled by a frequency counter with an input connected to the first input of said subtracting means via a gate operated by said second oscillator.

22. A circuit arrangement as defined in claim 17 wherein said regenerating circuitry comprises a plurality of regenerators each including an adjustable oscillator operating in an intermediate-frequency range and having a frequency-controlling input, said frequency-generating means including a fixed-frequency carrier oscillator common to all said regenerators, first frequency-conversion means connected to said carrier oscillator and further connected to respective output circuits of the adjustable oscillators of said regenerators for producing a plurality of local oscillations corresponding to as many test frequencies concurrently applicable to said test object, summing means for combining said local oscillations into said compensation signal, and second frequency-conversion means connected to said carrier oscillator and to said subtracting means for transposing said residual signal to said intermediate-frequency range, each of said regenerators further including an adjustable amplifier in the output circuit of the respective adjustable oscillator, a first and a second sampling switch connected in parallel to an output of said second frequency-conversion means, first integrating means inserted between said first sampling switch and the frequency-control input of the respective adjustable oscillator, second integrating means inserted between said second sampling switch and a gain-control input of said adjustable amplifier, a first pulse generator driven by the respective adjustable oscillator for closing said first sampling switch during zero crossings of the output frequency thereof, and a second pulse generator driven by the respective adjustable oscillator via a 90° phase shifter for closing said second sampling switch during peaks of said output frequency.

23. A circuit arrangement as defined in claim 22 wherein said evaluation means includes a stop circuit connected to said subtracting means for suppressing systematic components of said residual signal, a third sampling switch with a first storage capacitor inserted between said stop circuit and a weighting amplifier, a fourth sampling switch with a second storage capacitor inserted between a quadrature output of said first frequency-conversion means and a gain-control input of said weighting amplifier, a third pulse generator connected to an in-phase output of said first frequency-conversion means for closing said third and fourth sampling switches during zero crossings of said compensation signal, and a peak rectifier connected to said weighting amplifier for emitting a coefficient representative of phase-interference modulation.

24. A circuit arrangement as defined in claim 17 wherein said evaluation means includes a stop circuit connected to said subtracting means for suppressing systematic components of said residual signal, a sampling switch with a storage capacitor inserted between said stop circuit and an RMS rectifier, and a pulse generator connected to a quadrature output of said frequency-generating means for closing said sampling switch at instants offset by 90° from zero crossings of said compensation signal to produce a coefficient representative of noise level in the output of said RMS rectifier.

25. A circuit arrangement as defined in claim 24, further comprising two psophometric filters respectively inserted upstream of said stop circuits and of said pulse generator.

26. A circuit arrangement as defined in claim 23, 24 or 25 wherein said compensation signal includes a plurality of harmonically interrelated local oscillations corresponding to as many test frequencies applicable to said test object, said stop circuit comprising a number of parallel signal paths equal to the number of said local oscillations, each of said signal paths including a normally open switch in series with a respective blocking capacitor, and a control circuit for periodically closing said normally open switches at staggered instants during each cycle of said compensation signal.

27. A circuit arrangement as defined in claim 22 wherein said evaluation means includes an active filter connected to said subtracting means for suppressing nonsystematic components of said residual signal and an RMS rectifier connected to said active filter for emitting a coefficient representative of harmonics factor.

28. A circuit arrangement as defined in claim 27 wherein said adjustable oscillators have nominal output frequencies harmonically related to a common reference frequency, said active filter comprising a control circuit connected to an output of said frequency-generating means carrying said reference frequency, and a number of parallel signal paths equal to a multiple of the number of said local oscillations, each of said signal paths comprising a respective storage capacitor and switch means operated by said control circuit for periodically charging and discharging said storage capacitors at different instants during a cycle of said reference frequency.

* * * * *